(12) United States Patent
Chopade et al.

(10) Patent No.: US 11,516,947 B2
(45) Date of Patent: Nov. 29, 2022

(54) AIR-COOLED MOTOR CONTROLLER FOR CONTROLLING AT LEAST ONE ELECTRIC MOTOR AND METHOD FOR CONTROLLING A FAN OF A CORRESPONDING MOTOR CONTROLLER

(71) Applicant: Danfoss Power Electronics A/S, Gråsten (DK)

(72) Inventors: Amol Ramesh Chopade, Nordborg (DK); Marian Lungeanu, Graasten (DK); Henrik Rosendal Andersen, Graasten (DK)

(73) Assignee: Danfoss Power Electronics A/S, Gråsten (DK)

( * ) Notice: Subject to any disclaimer, the term of this patent is extended or adjusted under 35 U.S.C. 154(b) by 142 days.

(21) Appl. No.: 17/189,898

(22) Filed: Mar. 2, 2021

(65) Prior Publication Data
US 2021/0282302 A1   Sep. 9, 2021

(30) Foreign Application Priority Data

Mar. 5, 2020   (DE) .......................... 102020105961.2

(51) Int. Cl.
*H05K 7/20*   (2006.01)
*H02P 27/06*   (2006.01)
*G05D 23/19*   (2006.01)

(52) U.S. Cl.
CPC ......... *H05K 7/20909* (2013.01); *G05D 23/19* (2013.01); *H02P 27/06* (2013.01)

(58) Field of Classification Search
CPC ..... H05K 7/20909; G05D 23/19; H02P 27/06
See application file for complete search history.

(56) References Cited

U.S. PATENT DOCUMENTS

| 10,153,721 | B2 * | 12/2018 | Tseng | ................... H02M 1/32 |
| 2017/0176056 | A1 * | 6/2017 | Eicher | ................... F24F 13/20 |

FOREIGN PATENT DOCUMENTS

| DE | 30 32 031 A1 | 5/1981 | |
| DE | 102 32 717 A1 | 2/2004 | |
| DE | 10 2017 004 469 A1 | 11/2017 | |
| DE | 10 2018 002 948 A1 | 11/2018 | |
| DE | 10 2017 213 582 A1 | 2/2019 | |
| EP | 0 752 065 B1 | 9/1997 | |
| WO | WO2020/186349 | * 9/2020 | .............. H02M 7/70 |

* cited by examiner

*Primary Examiner* — Mukundbhai G Patel
(74) *Attorney, Agent, or Firm* — McCormick, Paulding & Huber PLLC

(57) ABSTRACT

The present invention refers to an air-cooled motor controller for controlling electric motors, comprising a heat-sink and a variable fan for cooling passive and active components of the motor controller by means of an air stream generated by the fan. The invention is directed towards a fan control means and a coupled fan control method for controlling the speed of the fan of the motor controller in response to the losses in both passive and active devices inside the motor controller.

20 Claims, 3 Drawing Sheets

AIR-COOLED MOTOR CONTROLLER FOR CONTROLLING AT LEAST ONE ELECTRIC MOTOR AND METHOD FOR CONTROLLING A FAN OF A CORRESPONDING MOTOR CONTROLLER

CROSS-REFERENCE TO RELATED APPLICATION

This application claims foreign priority benefits under 35 U.S.C. § 119 to German Patent Application No. 102020105961.2 filed on Mar. 5, 2020, the content of which is hereby incorporated by reference in its entirety.

TECHNICAL FIELD

The present invention refers to an air-cooled motor controller for controlling at least one electric motor, said motor controller comprising a heat-sink and a variable-speed fan for cooling passive and active components of the motor controller by means of an air stream generated by the fan. The invention concerns fan control means of a corresponding motor controller and a fan control method for controlling the speed of the fan.

BACKGROUND

In prior art, closed-loop fan controllers for air-cooled motor controllers are known to comprise a proportional-integral (PI) controller. The PI-controller regulates the speed (duty cycle) of a fan of the motor controller by determining the difference between a heat-sink temperature reference and a measured heat-sink temperature of a heat-sink of the motor controller.

By measuring the heat-sink temperature, it is possible, firstly, to indirectly estimate the temperatures of the components of the motor controller and, secondly, to control the temperatures of said components by adjusting the cooling air stream generated by the fan accordingly. As a result, the lifetime of components of the motor controller such as active and passive components, and in particular active components mounted on the heat-sink, can be enhanced.

Furthermore, motor controllers are known in the art, which comprise model-based feedforward fan controllers, which use a heat-sink temperature reference, a measured temperature of the heat-sink and the losses in a power module of the motor controller. The power-module losses may be calculated using voltage and current measurements and component models. Utilizing the power-module losses allows for achieving a faster control loop for cooling the motor controller components, as the actual power loss and therefore heat dissipation of some components is considered directly. The fan is therefore controlled more directly in dependence on the temperatures of components, which require cooling, thereby achieving lifetime improvements of the corresponding power module.

In the both cases of prior-art devices cited above, the focus of the fan control characteristics is the power module and the heat-sink, even though passive devices or passive components may be cooled by the air stream for the heatsink as a side effect.

A problem of the motor controllers known from the art is that, they take into account temperatures of components such as power modules, but do not directly take into account the temperatures of other sensitive passive and active components of the motor controller. This means that, known motor controllers may operate such passive and active components at suboptimal conditions and therefore cannot ensure their optimized i.e. longest possible lifetimes.

SUMMARY

The present invention aims at overcoming this problem by means of an air-cooled motor controller according to claim 1 and a process for controlling a corresponding air-cooled motor controller according to claim 10. Preferable embodiments of the invention are described in the dependent claims.

According to the invention, an air-cooled motor controller for controlling at least one electric motor is provided, said motor controller comprising a heatsink and a variable speed fan for cooling passive and active components of the motor controller by means of an air stream generated by the fan. The controller combines a first controller with a second controller for controlling the fan in a coupled control structure, wherein the first controller sets a base speed of the fan ($D_{fan}$) based on the characteristics of the active components attached to the heat-sink, and wherein the second controller is fed by the power loss of at least one passive component of the motor controller for adding an additional speed contribution to said base speed of the fan. The additional speed contribution may be a speed ripple of the fan ($D_{fan}$ variation) to the fan speed at a varying power loss of said passive component.

In a preferred embodiment, said first controller is a simple proportional-integral controller (PI controller) as known in the art of control engineering, while said second controller is a simple proportional controller (P controller).

The PI-controller may be responding to the difference between a heatsink-temperature reference ($T_{sinkref}$) and a measured heat-sink temperature ($T_{sink}$). The P-controller may be responding to the power loss of a passive component of the motor controller.

In another preferred embodiment, the heat-sink-temperature reference ($T_{sinkref}$) for the first controller is a function of the ambient temperature of the motor controller. In particular, the mathematical relation between the ambient temperature and the heat-sink-temperature reference may be determined according to degradation laws of active devices.

The variable-speed fan comprises an electric fan motor for driving the fan. The electric fan motor is different from the electric motor controlled by the motor controller. Whereas the electric fan motor may be a sub-component of the motor controller, which usually may be a small motor provided at or within the housing of the motor controller, the main motor controlled by the motor controller may usually be an external motor of greater size and used for conducting work outside the motor controller, such as rotating a shaft load, which could be a pump, a fan, a compressor etc.

The base speed of the variable-speed fan set by the first controller may be understood as a desired speed, defined by the needed cooling of the motor controller from a heat-sink perspective and the cooling performance of the fan. This desired speed defined by the first controller may be altered or corrected by the output of the second controller, which depends on the power loss of at least one passive component of the motor controller. The power loss of the passive component may be calculated by the current flowing through it, or by a current being an indication of the current passing through it. The loss calculation could be as simple as using the square of the current flowing through the device times its ohmic resistance. Any inaccuracy related to the calculation can be compensated by the final tuning of the second controller.

The overall desired speed of the fan therefore depends on the outputs of both, the first controller and the second controller. The first controller outputs a signal, which controls the fan to turn at some base speed, depending on the above-mentioned difference between the heat-sink temperature reference and a measured heat-sink temperature. The second controller corrects the output of the first controller, such that the combined output signals of the first controller and the second controller are more effective at controlling the fan speed to minimize the temperature swing of the at least one passive component at a varying power loss of said passive component.

The present invention takes into account the power loss of at least one of the passive components of the motor controller. As the power loss corresponds to the heat generation and therefore temperature of the passive component, the fan is controlled as a function of the temperature of the relevant component. The invention therefore makes it possible to minimize the temperature swing of said passive component using a single fan and a single fan controller at cyclic operation of the motor controller, while at the same time handling the cooling of a power module adequately for optimizing the overall lifetime of said motor controller. The invention makes it also possible, to minimize the temperature swing of other components of the motor controller.

According to a preferable embodiment of the invention, the at least one passive component is a magnetic, capacitive or resistive device, such as a RFI choke, a coil, an inductor, a capacitor, a filter, in particular a $2^{nd}$ order RFI filter, a transformer and/or a combination of the mentioned components. Additionally or alternatively, higher or lower order RFI filters may be used as passive components in the context of the present invention. In simple embodiments one or more RC, RL and/or RLC filters may be provided.

The above-mentioned components can be arranged in series. For example, the input side of the second controller may be connected directly or indirectly first, to a $2^{nd}$ order filter, and second, to another $2^{nd}$ order filter or to another of the above-mentioned passive components. If an indirect connection is provided between the second controller and one or more of the passive components, one or more summing points may be used, in particular for enabling and recombining multiple filtering steps.

According to another preferable embodiment of the invention, the first controller includes the heat-sink temperature reference ($T_{sinkref}$), which is a function of the ambient temperature ($T_{amb}$) of the motor controller. The first controller may receive a signal representative of the difference between the heat-sink-temperature reference and the actual temperature of the heat-sink ($T_{sink}$) through a second summing point. The heat-sink-temperature reference may be determined from the measured ambient temperature by means of a look-up table or some other mathematical component provided directly or indirectly for the first controller. In particular, the look-up table may be derived from a degradation law for active devices in a power module, such as the LESIT curve as known in the art, while considering start/stop temperature-swing effects of said motor controller.

Accordingly, the heat-sink-temperature reference may vary in dependence of the ambient temperature of the motor controller. For example, the heatsink-temperature reference may increase linearly with increased ambient temperature of the motor controller. The ambient temperature may be measured by some thermometer device provided at or near the motor controller. Alternatively, the ambient temperature may be calculated from a thermal model of the motor controller combined with a loss model of the motor controller and for example the measured heat-sink temperature $T_{sink}$.

According to another preferable embodiment of the invention, the output of the second controller is added to the output of the first controller, the output of the first controller corresponding to the base duty cycle set by heat-sink and power-module characteristics. However, the output of the first controller only takes into account the temperature of the passive component indirectly and in a time-delayed manner. In a worst-case operating condition of the motor controller, the first controller does not experience that, the power loss of a passive device in the motor controller varies, if the power-module losses remain essentially constant. This would be the case for a motor controller operated at variable-speed operation cycle with constant output current $i_{out}$ (see FIG. 2) to the motor, when the targeted passive device is or the target passive devices are situated in the rectifier side of the motor controller and being stressed by effects of the speed-dependent rectifier current $i_{rec}$ (see FIG. 2) in this case.

Accordingly, the passive component and possibly further components of the motor controller are not maintained at ideal temperatures by the fan. Adding the output of the second controller to the output of the first controller helps to overcome the above-mentioned limitations.

According to another preferable embodiment of the invention, the sum of the outputs of the second controller and the first controller is passed through a limit block before being passed to the fan, wherein in a particularly preferable embodiment, the limit block sets a minimum and/or maximum value of the speed of the fan ($D_{fan}$), said minimum and maximum values being functions of the overall design of the motor controller. The minimum and/or maximum value of the speed or average speed of the fan may depend on the type of electric fan motor driving the fan, the size of the fan or other parameters and/or design aspects of the motor controller.

According to another preferable embodiment of the invention, a tuning algorithm for the first and second controllers shall ensure that, the overall lifetime of the motor controller is optimized at both cyclic and non-cyclic operation of the motor controller considering both passive and active devices. Hence, the output of the first controller or the base speed of the first controller shall essentially equal the average speed of the fan and ripple speed related to power-loss variation of the power module. The output of the second controller shall essentially equal the ripple speed of the fan related to the power-loss variation of a passive device or passive devices at both cyclic and non-cyclic operation of the motor controller. Said passive device or passive devices may be subjected to the airstream of the fan.

According to another preferable embodiment of the invention, the at least one passive component is placed directly in the air stream generated by the fan. The position of the passive component may be chosen such that the passive component is provided within a volume defined by a projection of the outer circumference of the fan, wherein the projection is directed in a direction perpendicular to the plane defined by the fan turning direction.

The passive component may be selected to be a component, which is particularly sensitive to overheating. Additionally or alternatively, the passive component may be selected to be a component of the motor controller, which, among all components of the motor controller, is known to generate the greatest or nearly the greatest temperature rise and/or to be most susceptible to damage from overheating and temperature swings.

According to another preferable embodiment of the invention, the air stream passes through the heat-sink, said heat-sink having active devices attached to it. Additionally or alternatively, the motor controller may comprise a single fan.

According to another preferable embodiment of the invention, a tuning algorithm of the coupled first controller and second controller optimizes the overall lifetime of the motor controller at cyclic and/or non-cyclic operation of said motor controller.

The invention is also directed at a process according to claim 10. The process controls an electric fan motor of an air-cooled motor controller according to any of claims 1 to 9. The process comprises controlling of the fan motor by combining the outputs of a first controller with a second controller, wherein as an output, the first controller sets a base speed of the fan ($D_{fan}$), said base speed being based on the difference between a heat-sink temperature reference ($T_{sinkref}$) and a measured heat-sink temperature ($T_{sink}$), and wherein as an input, the second controller is fed the power loss of at least one passive component of the motor controller.

In general, the process may comprise any additional features and steps, which are described with reference to the air-cooled motor controller.

In particular, the presently described process may include a PI-controller as the first controller, said PI-controller responding to the difference between a heat-sink-temperature reference ($T_{sinkref}$) and a measured heat-sink temperature ($T_{sink}$).

Furthermore, the process may comprise a P-controller as the second controller, said P-controller responding to the power loss of a passive component of the motor controller.

The heat-sink-temperature reference ($T_{sinkref}$) for the first controller may be a function of the ambient temperature of the motor controller, wherein, preferably, the mathematical relation between the ambient temperature and the heatsink-temperature reference is determined according to degradation laws of active devices.

BRIEF DESCRIPTION OF THE DRAWINGS

Further details and advantages of the invention are described with reference to the following figures.

DETAILED DESCRIPTION

Figure 1:
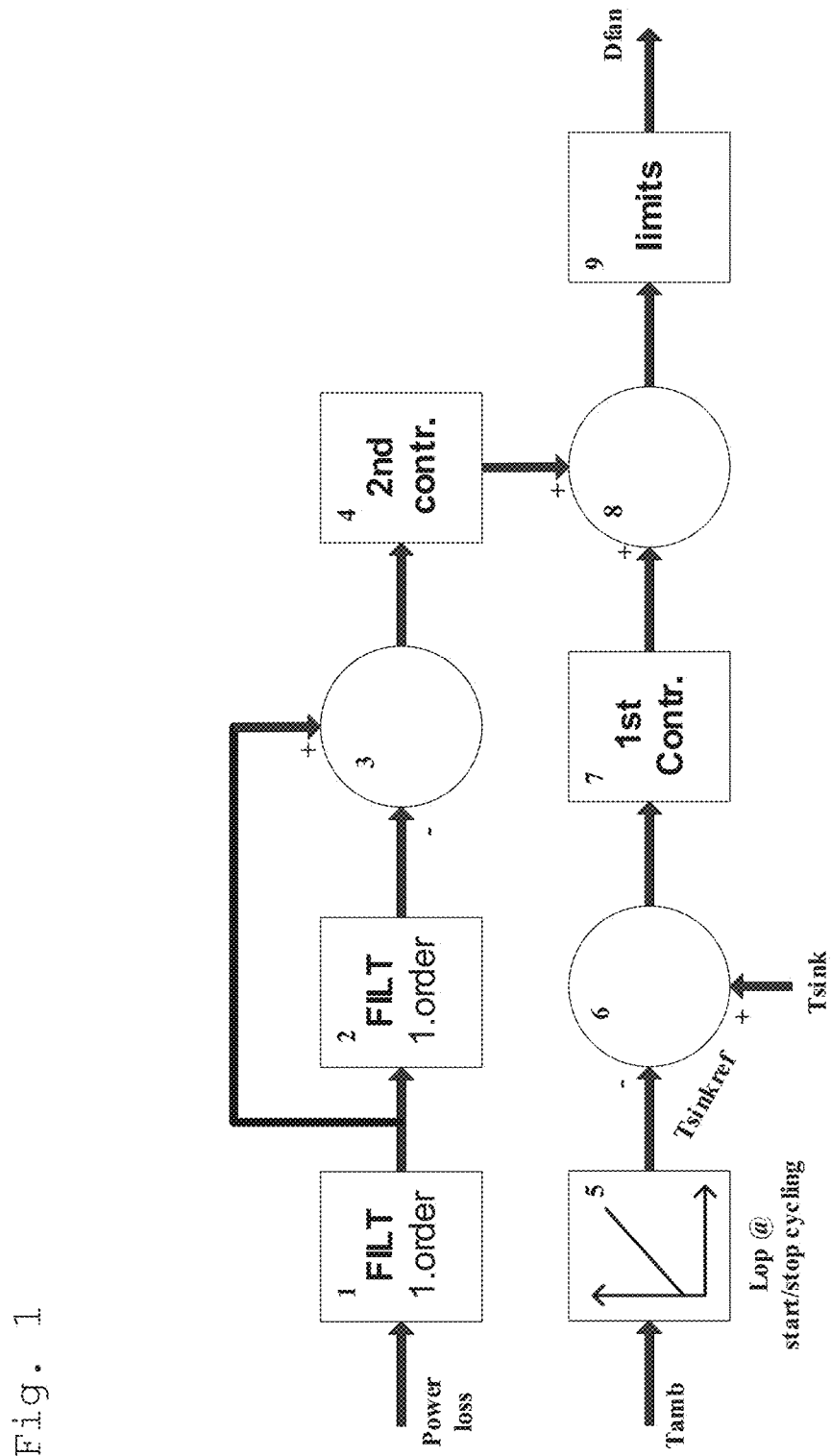
FIG. 1: shows a block diagram of the control used for controlling the electric motor fan of the motor controller.
Figure 2:
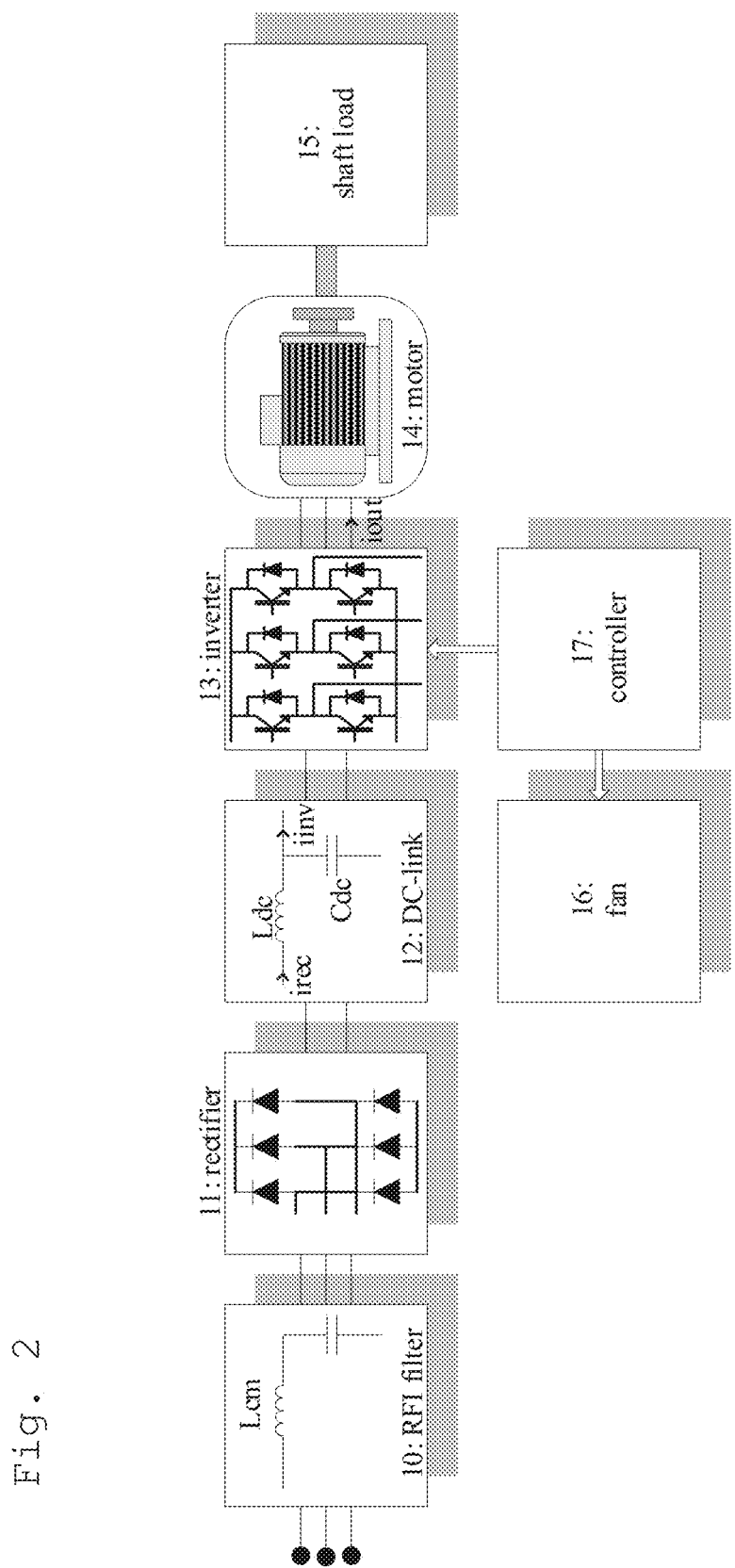
FIG. 2: shows a schematic view of the motor controller in connection with an external motor.

The block diagram of FIG. 1 refers to the control layout for controlling the electric-motor fan 16 of the present invention's air-cooled motor controller, wherein the fan 16 is shown in FIG. 2. The entire motor controller is not shown in FIG. 1, as additional components of the motor controller, such as those shown in FIG. 2, may correspond to any motor controllers known from the art.

An air-cooled motor controller according to the invention may comprise control architecture represented by the block diagram shown in FIG. 1. The motor controller is used for controlling at least one electric motor 14 as shown in FIG. 1. The motor 14 may be used in an industrial application.

The motor controller may comprise one or more heat sinks 23 and one or more variable speed fans 16 for cooling passive and active components of the motor controller by means of an air stream generated by the fan 16.

The fan 16 may generate a cooling airstream from the outside of the motor controller into its inside being directed towards heated components of the motor controller by the shape of the air channel or cooling channel. The controller may combine e.g. a PI-controller as a first controller 7 with e.g. a P-controller as a second controller 4 for controlling the fan 16. The PI-controller passes an output into the electric fan 16 motor, which is aimed at generating a base speed of the fan 16 ($D_{fan}$) based on the difference between a heat-sink temperature reference ($T_{sinkref}$) and a measured heat-sink temperature ($T_{sink}$). The difference between the heat-sink temperature reference ($T_{sinkref}$) and the measured heat-sink temperature ($T_{sink}$) is determined at the second summing point 6. The P-controller is fed by the power loss of at least one passive component of the motor controller and the output of the P-controller is added to the output of the PI-controller to generate a combined control signal for controlling the electric fan 16 motor.

The at least one passive component feeding the P-controller with its power loss is a magnetic, capacitive or resistive device, such as a RFI choke, a coil, an inductor, a capacitor, a filter, in particular a $2^{nd}$ or higher order RFI filter, a transformer and/or a combination of the mentioned components. In case a combination of the mentioned components is employed for generating an input signal corresponding to the power loss occurring at said components, the components may be arranged in series, in parallel or in any necessary way with respect to each other. The passive component is not shown in FIG. 1 but its input into a first $1^{st}$-order filter 1 and a second $1^{st}$-order filter 2 is indicated on the top left of FIG. 1 by an arrow depicting the power loss input into the $1^{st}$-order filters 1, 2 arranged in the upper branch of the P-controller. Although two $1^{st}$-order filters 1, 2 are shown in FIG. 1, the present motor controller may comprise more than two filters, only one filter or it may comprise no filters at all, connecting the second controller 4 to one or more other passive components instead. In case two filters 1, 2 are used, the output of said filters 1, 2 may be combined at a first summing point 3 prior to its input into the second controller 4. The reference to filters 1, 2 may comprise filters of any order, even though $1^{st}$ order filters may be mentioned in the description or shown in the figures.

Although not shown in FIG. 1, the at least one passive component may be placed directly in the air stream generated by the fan 16, maximizing the heat dissipation away from the passive component. Additionally or alternatively, the air stream may pass through the heat sink 23. The passive component and the heat sink 23 may be arranged in parallel or in series with respect to each other and to the air stream generated by the fan. According to the present invention, a single fan 16 or a plurality of fans 16 may be used. The heat-sink 23 may comprise active and/or passive devices attached to it, thereby further facilitating their cooling.

The first controller 7 is shown in a lower branch of FIG. 1 and includes the heat-sink temperature reference ($T_{sinkref}$), which is a function of the ambient temperature ($T_{amb}$) of the motor controller. The motor controller may comprise some thermometer device for establishing the ambient temperature, said thermometer device not being shown in the figure. Alternatively, the ambient temperature may be calculated from a model of the motor controller. The ambient temperature may be provided indirectly to the first controller 7, in that a heat-sink temperature reference is determined from the ambient temperature first, via e.g. a lookup table 5, and a value representative of the heat-sink temperature reference is passed on to the first controller 7.

The output of the second controller 4 is added to the output of the first controller 7 at the third summing point 8 in FIG. 1. The output of the first controller 7 corresponds to the base duty cycle or desired fan 16 speed set by heat-sink 23 and power-module characteristics.

The sum of the outputs of the second controller 4 and the first controller 7 is passed through a limit block 9 before being passed to the fan 16 as $D_{fan}$. The limit block 9 may set a minimum and/or maximum value of the speed of the fan 16 ($D_{fan}$), said minimum and maximum values being functions of the overall design of the motor controller. The minimum and/or maximum values of the fan 16 speed are set by corresponding minimum and/or maximum output values, e.g. current and/or voltage values, passed through the limit block 9.

The motor controller may be equipped with a single fan 16. Alternatively, the motor controller may comprise two or more fans 16, which may be a least partially controlled in the presently described manner. The fan 16 is controlled to optimize the lifetime of passive and/or active components inside the motor controller.

Passive components of the motor controller can typically comprise magnetic, capacitive or resistive devices, such as e.g. a RFI choke or similar. The passive components may be placed directly in an air stream passing through a heat sink 23 said heat sink 23 having active devices attached to it. As an example, the active devices could be IGBTs and diodes contained in a power module. The present invention aims at minimizing the temperature swing of an active device and an active device using a single fan 16 and a single fan controller 17 at cyclic operation of the motor controller. The fan controller 17 can be understood to comprise some or all of the components shown in FIG. 1, in particular the first controller 7 and the second controller 4.

As shown in FIG. 1, the present invention may combine a conventional PI-controller as a first controller 7 aiming to set a base speed or duty cycle ($D_{fan}$) of the variable speed fan 17 by the difference between a heat-sink temperature reference ($T_{sinkref}$) and a measured heat-sink temperature ($T_{sink}$) with a P-controller as second controller 4 aiming at minimizing the temperature swing of a passive device. The first controller 7 includes a temperature reference $T_{sinkref}$ of the heatsink 23, said temperature reference being a function of the ambient temperature $T_{amb}$ of the motor controller.

A first part of the present invention improves the lifetime of both, the power module and passive devices of the motor controller, in particular at start/stop power cycling by introducing a dependency of the ambient temperature of the motor controller to the first controller. Additionally, the output of the second controller 4 is added to the base duty cycle set by the heat-sink 23 and power-module characteristics. The second controller 4 is fed by the power loss of a passive device, such as a RFI choke 22, in the motor controller. By utilizing simple first-order filter blocks in a preferred embodiment, the aim of the second controller 4 is to vary the fan speed cyclically, around the average value set by the first controller 7 and in phase with the cyclic variations of the power loss of the passive device.

This minimizes the temperature swing of the passive device and optimizes its lifetime in terms of solder joints etc. The tuning of the first-order filters determines the frequency range in which the second controller 4 shall respond to variation of the losses in the passive device. For those skilled in the art, solder-joint degradation is especially sensitive to variations in the minute range and upwards. The sum of the outputs of the second 4 and first 7 controller may be passed through a limit block 9 before being sent to the fan 16. The limit block 9 may set a minimum and maximum value of $D_{fan}$ being a function of the overall design of the motor controller.

FIG. 2 shows a schematic view of the motor controller in connection with an external motor 14, driving e.g. a shaft load 15. The motor controller controls the motor 14 and may comprise an RFI filter 10, a rectifier 11, a DC-link 12 as well as an inverter 13, connected to each other. The inverter 13 may provide an output into the motor 14, controlling the desired movement of the motor 14. The inverter 13 may further be connected to the controller 17 for controlling the fan 16, meaning that the same controller handles both the inverter control and the fan control. The controller 17 may comprise the first controller 7 and the second controller 4, as described above. The inverter control part of 17 is well known to those skilled in the art.

Figure 3:
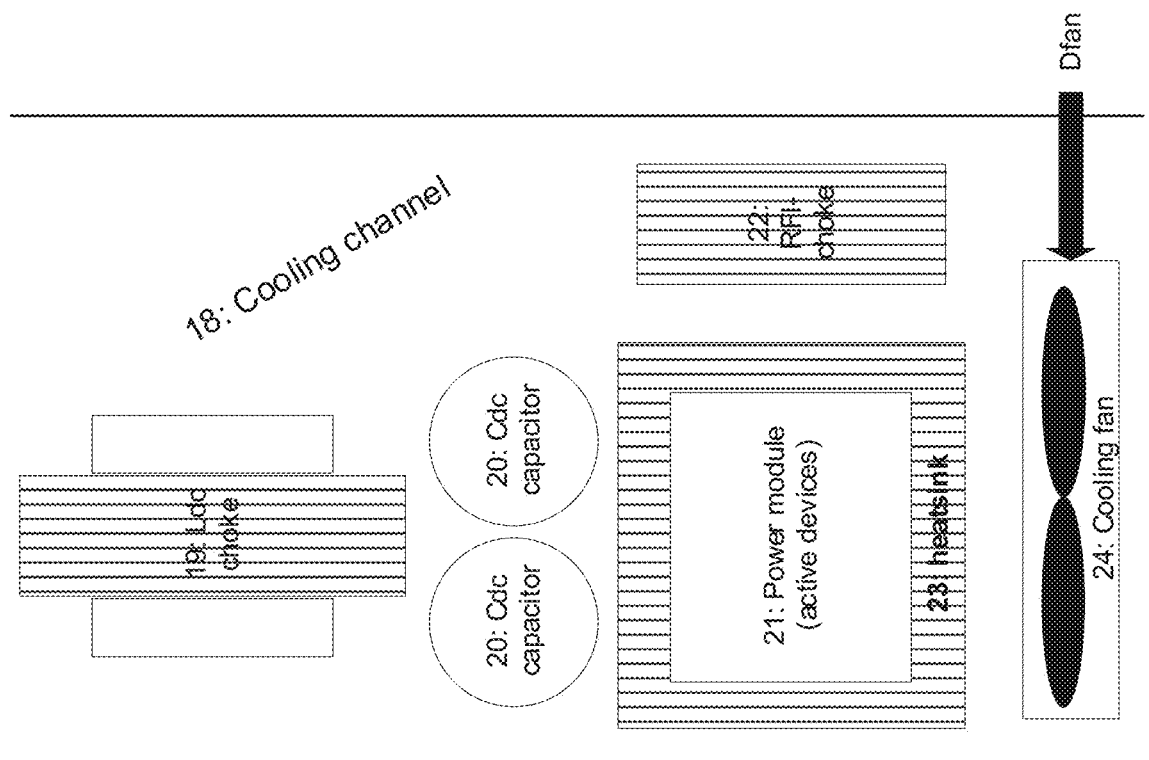
FIG. 3: shows a schematic layout view of a motor controller with respect to possible components exposed to a fan-induced airstream in a cooling channel of the motor controller.

FIG. 3 shows a schematic layout view of a motor controller. A cooling fan 24 is controlled by the motor controller in the above-described manner, receiving a signal $D_{fan}$. A first component of the motor controller positioned downstream of the fan 24 may be the heat sink 23, to which the power module 21 may be attached. Said power module 21 may comprise active devices of the motor controller.

A RFI choke 22 may be provided in parallel to the heat-sink 23 with respect to the airflow generated by the fan 24. Further downstream of the heat-sink 23 may be at least one Cdc capacitor 20. In the embodiment of FIG. 3, two Cdc capacitors 20 are shown in parallel with respect to the airstream. Downstream of the Cdc capacitors 20, an Ldc choke 19 may be provided. All or at least some of the components mentioned with respect to FIG. 3 may be provided in a cooling channel 18.

The present invention allows designing compact products with an optimized lifetime. The invention may be implemented in association with software packages for running the motor control. Depending on the actual electric fan motor and other components of the motor controller, the two coupled controllers 4, 7 may be tuned such that, the fan control may be conducted correctly for optimizing the overall lifetime of the motor controller at cyclic mission profiles.

The fast controlling method workable with the present invention solves an issue with tin soldering of components such as copper windings from a magnetic, capacitive or resistive device of the motor controller, which may be soldered to a printed-circuit-board assembly. The temperature swing of the tin solder at a specific operation cycle of the motor controller, may as an example be 5° C. less according to the invention, when compared to prior art. As a result, less stress is put on the tin soldering. This will increase the overall lifetime of the motor controller or power converter compared to devices known form prior art.

Devices known from the art usually measure temperatures in the heat sink 23 or inverter 13 of the motor controller, where typically the largest power losses of the motor controller occur. However, devices known from prior art will have a slower response time or no response at all depending on the mission profile of the motor controller, and therefore the temperature swing on e.g. tin solder in the filters 10, 12 would be higher than is the case with the present invention.

The present invention is also directed at a process for controlling an electric fan motor of an air-cooled motor controller as previously described. The process comprises controlling of the fan motor by combining the outputs of the above-described first controller 7 and second controller 4.

The output of the first controller 7 represents a signal which sets a base speed of the fan ($D_{fan}$), said base speed being based on the difference between a heat-sink temperature reference ($T_{sinkref}$) and a measured heat-sink temperature ($T_{sink}$). The term base speed may be understood in a broad sense and may refer to for example an average speed in short time intervals of only a few minutes, seconds or even milliseconds. The input of the second controller 4 corresponds to the power loss of at least one passive component of the motor controller. The corresponding signal is fed to the second controller 4 and varies the combined output signal of the second controller 4 and first controller 7 accordingly.

The invention is not limited to one of the above-described embodiments, but can be modified in many ways.

All of the features and advantages arising from the claims, the description and the drawings, including constructive details, spatial arrangements and procedural steps, can be essential to the invention both individually and in the most varied of combinations.

What is claimed is:

1. An air-cooled motor controller for controlling at least one electric motor, said motor controller comprising a heat sink and a variable-speed fan for cooling passive and active components of the motor controller by means of an air stream generated by the fan, that wherein
   the controller combines a first controller with a second controller for controlling the fan, wherein
      the first controller sets a base speed of the fan based on the characteristics of the active components attached to the heat sink, and wherein
      the second controller is fed by the power loss of at least one passive component of the motor controller for adding an additional speed contribution to said base speed of the fan.

2. The air-cooled motor controller according to claim 1, wherein the first controller is a PI-controller responding to the difference between a heat-sink-temperature reference ($T_{sinkref}$) and a measured heat-sink temperature ($T_{sink}$).

3. The air-cooled motor controller according at least to claim 2, wherein the heat-sink-temperature reference ($T_{sinkref}$) for the first controller is a function of the ambient temperature of the motor controller.

4. The air-cooled motor controller according to claim 3, wherein the mathematical relation between the ambient temperature and the heat-sink-temperature reference ($T_{sinkref}$) is determined according to degradation laws of active devices.

5. The air-cooled motor controller according to claim 3, wherein the at least one passive component is a magnetic, capacitive or resistive device, such as a RFI choke, a coil, an inductor, a capacitor, a filter, in particular a $2^{nd}$ order RFI filter, a transformer and/or a combination of the mentioned components.

6. The air-cooled motor controller according to claim 2, wherein the second controller is a P-controller responding to the power loss of a passive component of the motor controller.

7. The air-cooled motor controller according to claim 2, wherein the at least one passive component is a magnetic, capacitive or resistive device, such as a RFI choke, a coil, an inductor, a capacitor, a filter, in particular a $2^{nd}$ order RFI filter, a transformer and/or a combination of the mentioned components.

8. The air-cooled motor controller according to claim 1, wherein the second controller is a P-controller responding to the power loss of a passive component of the motor controller.

9. The air-cooled motor controller according to claim 8, wherein the at least one passive component is a magnetic, capacitive or resistive device, such as a RFI choke, a coil, an inductor, a capacitor, a filter, in particular a $2^{nd}$ order RFI filter, a transformer and/or a combination of the mentioned components.

10. The air-cooled motor controller according to claim 1, wherein the at least one passive component is a magnetic, capacitive or resistive device, such as a RFI choke, a coil, an inductor, a capacitor, a filter, in particular a $2^{nd}$ order RFI filter, a transformer and/or a combination of the mentioned components.

11. The air-cooled motor controller according to claim 1, wherein the output of the second controller is added to the output of the first controller, the output of the first controller corresponding to the base duty cycle set by heat sink and power-module characteristics.

12. The air-cooled motor controller according to claim 1, wherein the sum of the outputs of the second controller and the first controller is passed through a limit block before being passed to the fan.

13. The air-cooled motor controller according to claim 12, wherein the limit block sets a minimum and/or maximum value of the speed of the fan, said minimum and maximum values being functions of the overall design of the motor controller.

14. The air-cooled motor controller according to claim 1, wherein the at least one passive component is placed directly in the air stream generated by the fan.

15. The air-cooled motor controller according to claim 1, wherein the air stream passes through the heat sink, said heat sink having active devices attached to it.

16. The air-cooled motor controller according to claim 1, wherein it comprises a single fan.

17. The air-cooled motor controller according to claim 1, wherein the base speed of the first controller essentially equals the average speed of the cooling fan and ripple speed related to loss variation of the power module.

18. The air-cooled motor controller according to claim 1, wherein the output of second controller essentially equals the ripple speed of the cooling fan related to loss variation of a passive device or passive devices subjected to the airstream of the fan.

19. The air-cooled motor controller according to claim 1, wherein a tuning algorithm of the coupled first controller and second controller optimizes the overall lifetime of the motor controller at cyclic and/or non-cyclic operation of said motor controller.

20. A process for controlling an electric fan motor of an air-cooled motor controller according to claim 1, wherein
    it comprises controlling of the fan motor by combining the outputs of a first controller with a second controller, wherein
       as an output, the first controller a base speed of the fan, said base speed being based on the difference between a heat-sink temperature reference ($T_{sinkref}$) and a measured heat-sink temperature ($T_{sink}$), and wherein as an input, the second controller is fed the power loss of at least one passive component of the motor controller.

\* \* \* \* \*